(12) United States Patent
Yun et al.

(10) Patent No.: US 7,842,600 B2
(45) Date of Patent: Nov. 30, 2010

(54) METHODS OF FORMING INTERLAYER DIELECTRICS HAVING AIR GAPS

(75) Inventors: Jong-ho Yun, Gyeonggi-do (KR); Jong-Myeong Lee, Gyeonggi-do (KR); Gil-heyun Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 124 days.

(21) Appl. No.: 12/364,598

(22) Filed: Feb. 3, 2009

(65) Prior Publication Data

US 2009/0298282 A1    Dec. 3, 2009

(30) Foreign Application Priority Data

May 28, 2008    (KR) ...................... 10-2008-0049675

(51) Int. Cl.
  *H01L 21/4763* (2006.01)
(52) U.S. Cl. ...................... 438/619; 438/624; 438/637; 257/E21.581
(58) Field of Classification Search .................. 438/619, 438/624, 626, 637, 650, 652, 653; 257/E21.581
See application file for complete search history.

(56) References Cited

U.S. PATENT DOCUMENTS

| | | | |
|---|---|---|---|
| 6,083,821 A * | 7/2000 | Reinberg ..................... | 438/619 |
| 6,524,948 B2 * | 2/2003 | Tamaoka et al. ............ | 438/637 |
| 6,838,354 B2 | 1/2005 | Goldberg et al. | |
| 7,078,352 B2 * | 7/2006 | Beyer et al. ................. | 438/739 |
| 7,091,611 B2 | 8/2006 | Ahn et al. | |
| 7,666,753 B2 * | 2/2010 | Bonilla et al. ............... | 438/421 |
| 2009/0302473 A1 * | 12/2009 | Shibata et al. .............. | 257/751 |

FOREIGN PATENT DOCUMENTS

JP    2007-523465    8/2007

* cited by examiner

*Primary Examiner*—Tuan N. Quach
(74) *Attorney, Agent, or Firm*—Myers Bigel Sibley & Sajovec, P.A.

(57) ABSTRACT

Methods of forming an interlayer dielectric having an air gap are provided including forming a first insulating layer on a semiconductor substrate. The first insulating layer defines a trench. A metal wire is formed in the trench such that the metal wire is recessed beneath an upper surface of the first insulating layer. A metal layer is formed on the metal wire, wherein the metal layer includes a capping layer portion filling the recess, a upper portion formed on the capping layer portion, and an overhang portion formed on the portion of the first insulating layer adjacent to the trench protruding sideward from the upper portion. The first insulating layer is removed and a second insulating layer is formed on the semiconductor substrate to cover the metal layer, whereby an air gap is formed below the overhang portion of the metal layer. A portion of the second insulating layer is removed to expose the upper portion of the metal layer. The upper portion and the overhang portion of the metal layer are removed. A third insulating layer is formed on the semiconductor substrate from which the upper portion and the overhang portion have been removed to maintain the air gap.

16 Claims, 4 Drawing Sheets

METHODS OF FORMING INTERLAYER DIELECTRICS HAVING AIR GAPS

CLAIM OF PRIORITY

This application claims priority to Korean Patent Application No. 10-2008-0049675, filed May 28, 2008, in the Korean Intellectual Property Office, the disclosure of which is incorporated herein in its entirety by reference.

FIELD OF THE INVENTION

The present invention relates to semiconductor devices and, more particularly, to methods of forming an interlayer dielectric having an air gap.

BACKGROUND OF THE INVENTION

As the size of semiconductor devices continues to decrease in order to improve the degree of integration, a resistor-capacitor (RC) delay related to wires of a circuit becomes a limiting factor affecting the speed of semiconductor devices. To reduce the RC delay, copper, which has a relatively low resistance, is used as a wire material, and a low-k material is used in an interlayer dielectric.

To use low-k materials, development of a novel material and application for a device are needed and, thus, may cost a large amount of money. Furthermore, even if a low-k material is used, effective k may increase, taking into consideration impacts of materials used in an etch stop layer or a barrier layer. Moreover, a low-k material typically has poor thermal stability and, therefore, properties of the low-k material may be modified by heat applied during formation of polysilicon used as a mask material in a double patterning process for forming bit lines, resulting in high dielectric constant.

Recently, a process of introducing an air gap into inter metal dielectrics (IMD) between wire lines has been used. Since air has a dielectric constant of 1.0, IMD having an air gap has a small effective k. FIG. 1 is a cross-section illustrating conventional formation of an air gap in a multi-layer wiring structure. As illustrated in FIG. 1, a first-layer copper pattern 20 and a second-layer copper pattern 40 are formed on a semiconductor substrate 10, and a copper line 30 having a narrower width than the widths of the first and second-layer copper patterns 20 and 40 is formed between the first-layer copper pattern 20 and the second-layer copper pattern 40. A low-k dielectric 50 is deposited using the second-layer copper wiring pattern 40 as a mask to form an air gap 55 below the second-layer copper pattern 40. Thus, to form an air gap, formation of a pattern having a greater width than that of a metal wiring line may be needed. However, In the case of bit lines, which do not constitute multi-layer structures, a mask pattern layer for forming an air gap may be needed.

SUMMARY OF EMBODIMENTS OF THE INVENTION

Some embodiments of the present invention provide methods of forming an interlayer dielectric having an air gap including forming a first insulating layer on a semiconductor substrate. The first insulating layer defines a trench. A metal wire is formed in the trench such that the metal wire is recessed beneath an upper surface of the first insulating layer. A metal layer is formed on the metal wire, wherein the metal layer includes a capping layer portion filling the recess, a upper portion formed on the capping layer portion, and an overhang portion formed on the portion of the first insulating layer adjacent to the trench protruding sideward from the upper portion. The first insulating layer is removed and a second insulating layer is formed on the semiconductor substrate to cover the metal layer, whereby an air gap is formed below the overhang portion of the metal layer. A portion of the second insulating layer is removed to expose the upper portion of the metal layer. The upper portion and the overhang portion of the metal layer are removed. A third insulating layer is formed on the semiconductor substrate from which the upper portion and the overhang portion have been removed to maintain the air gap.

In further embodiments of the present invention, forming the first insulating layer may be preceded by forming an etch stop layer on the semiconductor substrate.

In still further embodiments of the present invention, forming the metal wire may be preceded by forming a barrier layer on sidewalls and a bottom of the trench.

In some embodiments of the present invention, the metal wire may be formed by electroless plating.

In further embodiments of the present invention, the metal wire may include at least one layer of copper (Cu), platinum (Pt) and/or silver (Ag). In certain embodiments, the metal wire may include an impurity of P, B, W, Mn, or Mo.

In still further embodiments of the present invention, the metal layer may be formed by electroless plating.

In some embodiments of the present invention, the metal layer may include at least one layer of Co, Ni, Pt, Pd, Rh, Ru, and/or Re. In certain embodiments, the metal layer includes an impurity of P, B, W, Mn, or Mo.

In further embodiments of the present invention, the second insulating layer may have a void between the metal wires.

In still further embodiments of the present invention, the first insulating layer may be selectively removed by wet etching.

In some embodiments of the present invention, the metal layer may be removed by wet etching using a mixed solution of phosphoric acid, acetic acid, and nitric acid.

In further embodiments of the present invention, the second insulating layer may include a low-k dielectric having a dielectric constant of from about 1.5 to about 4.0.

In still further embodiments of the present invention, the second insulating layer may include one selected from the group consisting of HOSP, HSQ, SiLK™, Flare™, BlackDiamond™, and these materials with increased porosity.

In some embodiments of the present invention, the third insulating layer may include the same material as that of the second insulating layer.

In further embodiments of the present invention, the third insulating layer may include silicon oxide.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
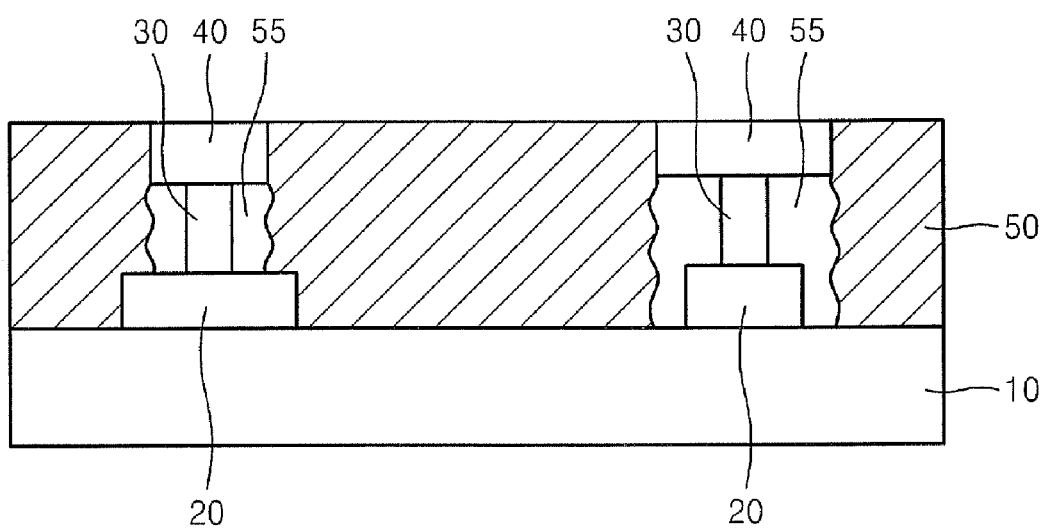
FIG. 1 is a cross-section illustrating conventional formation of an air gap in a multi-layer wiring structure.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2A:
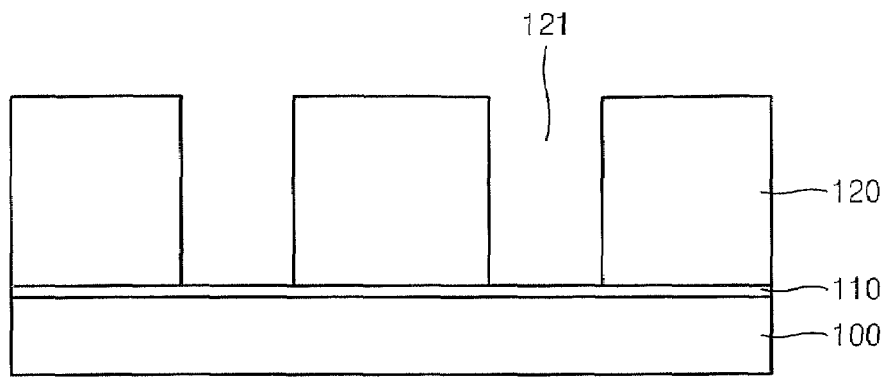
FIGS. 2A through 2H are cross-sections illustrating processing steps in the fabrication of an interlayer dielectric having an air gap according to some embodiment of the present invention.

FIGS. 2A through 2H are cross-sections illustrating processing steps in the fabrication of forming an interlayer dielectric having an air gap according to some embodiments of the present invention. As used herein, metal wiring structures are understood to include bit lines. Referring first to FIG. 2A, an etch stop layer 110 and a first insulating layer 120 are sequentially formed on a semiconductor substrate 100, and then the first insulating layer 120 is etched to form trenches 121 for forming metal wires. The first insulating layer 120 is removed in subsequent processes, and thus the first insulating layer 120 does not need to be formed of a low dielectric material and the first insulating layer 120 can be formed of silicon oxide. The etch stop layer 110 is formed of a material having an etch selectivity with respect to the first insulating layer 120, and can be formed of silicon nitride.

Figure 2B:
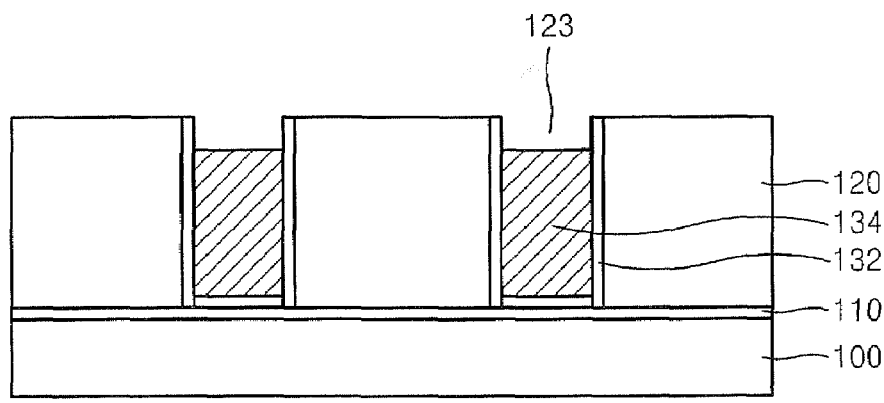

Referring to FIG. 2B, barrier layers 132 and metal wires 134 are formed in the trenches 121. The metal wires 134 can be formed of copper (Cu), platinum (Pt), or silver (Ag) by electroless plating, or can be formed of an alloy thereof, or can be a double layer of these materials or a multi-layer of these materials. In addition, a material used for the metal wires 134 may comprise an impurity such as P, B, W, Mn, or Mo. Also, a seed layer (not shown) for forming metal wires may be used. The metal wires 134 are formed in the trenches 121 to allow a top portion of the trench 121 to have a recess 123. The barrier layer 132 prevents diffusion of copper of the metal wire 134, and may be formed of Ta, TaN, SiC, or the like.

Figure 2C:
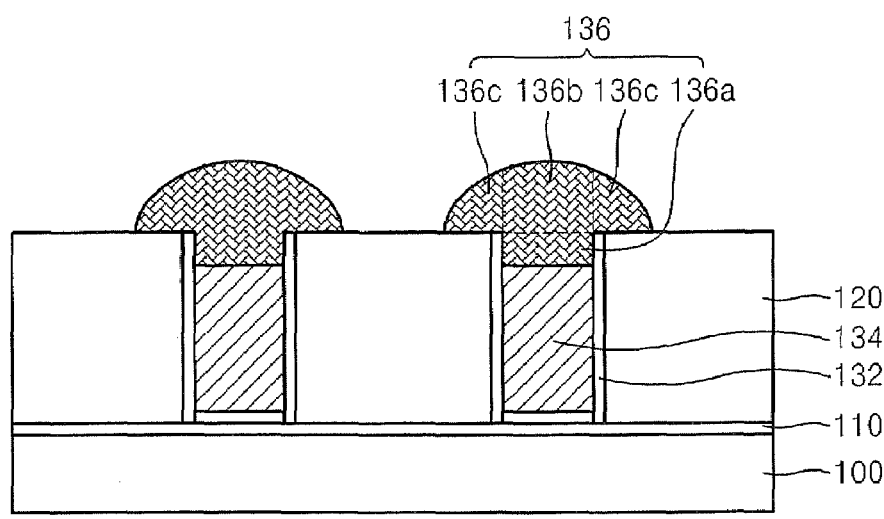

Referring to FIG. 2C, a metal layer 136 may be formed on the metal wires 134. Instead of forming the metal layer 136 on all the surface of the semiconductor substrate 100, the metal layer 136 may be formed selectively on the metal wires 134 by electroless plating. The metal layer 136 may be formed of Co, Ni, Pt, Pd, Rh, Ru, Re, or an alloy thereof, or may be a double layer of these materials or a multi-layer of these materials. In addition, the metal layer 136 may be formed to include an impurity such as P, B, W, Mn, or Mo. The metal layer 136 includes a capping layer portion 136a that fills the recess 123 and is formed on the metal wire 134, and mask portions 136b and 136c that are formed on the capping layer portion 136a. The mask portions 136b and 136c can be divided into an upper portion 136b covering the capping layer portion 136a and an overhang portion 136c covering the portion of the first insulating layer 120 adjacent to the trench 121. In this regard, the mask portions 136b and 136c are formed by overgrowing from the capping layer portion 136a and a top surface thereof can be spherical.

Figure 2D:
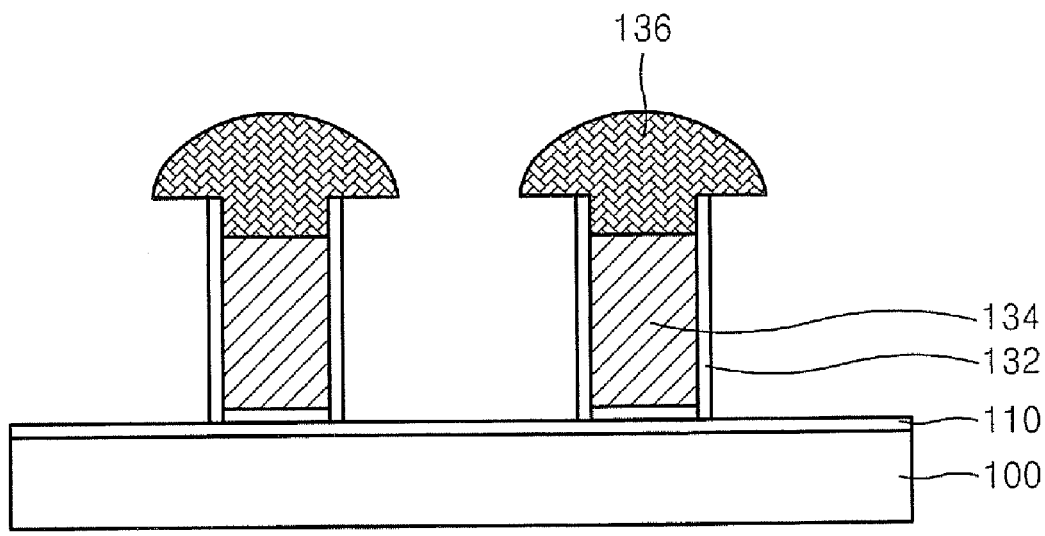

Referring to FIG. 2D, the first insulating layer 120 is removed by wet etching. The entire sacrificial insulation layer 120 including a portion formed below the overhang portion 136c of the metal layer 136 is removed, and patterns of the metal wire 134 surrounded by the barrier layer 132 and the metal layer 136 remain.

Figure 2E:
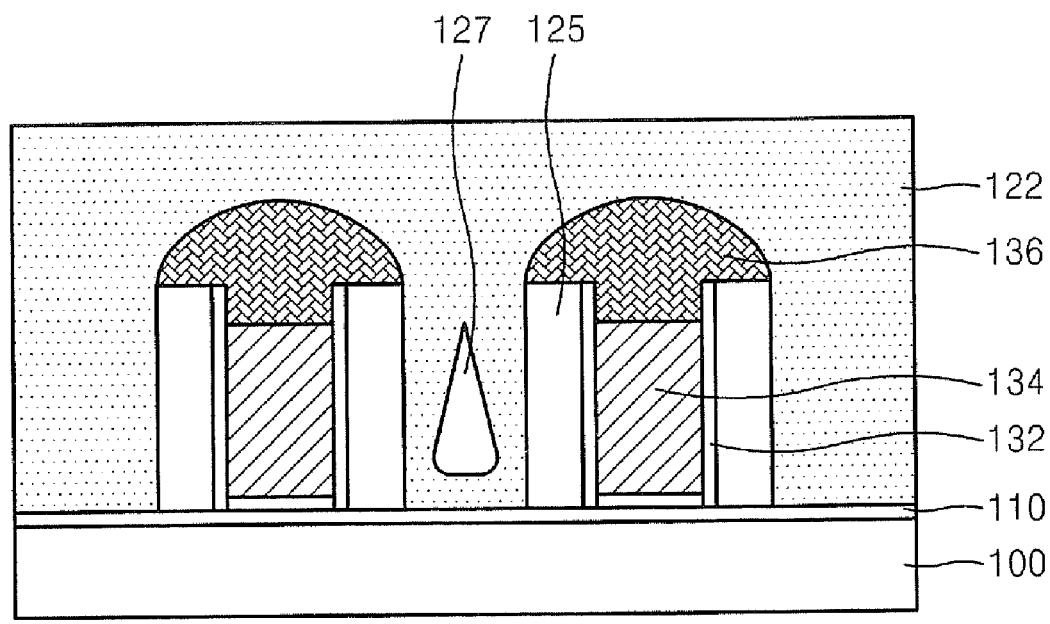

Referring to FIG. 2E, a second insulating layer 122 is formed on the semiconductor substrate 100 from which the first insulating layer 120 has been removed. The second insulating layer 122 is not conformally formed. The second insulating layer 122 may be formed of a low-k dielectric material, or generally formed of silicon oxide. In this regard, a low-k dielectric refers to a dielectric having a dielectric constant of 1.5-4. The low-k dielectric may be formed of an inorganic polymer, such as hybrid-organic-siloxane-polymer (HOSP) or hydrogen silsesquioxane (HSQ), an organic material, such as SiLK™, Flare™, or Black-Diamond™, or these materials with increased porosity. When the second insulating layer 122 is formed, the overhang portion 136c acts as a deposition cover, whereby an air gap 125 is formed below the overhang portion 136c of the metal layer 136. In addition, a void 127 may further be formed between the metal wires 134 by nonconformal formation of the second insulating layer 122.

Figure 2F:
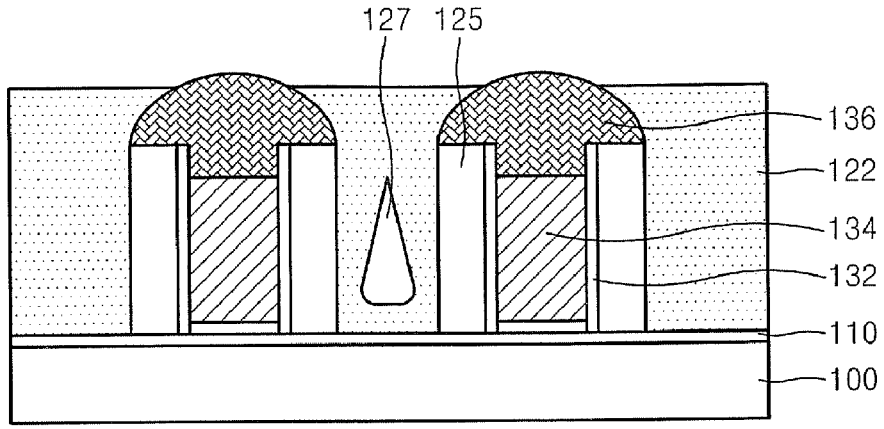

Referring to FIG. 2F, a portion of the second insulating layer 122 is removed to expose the upper portion 136b of the metal layer 136. Since the top surface of the metal layer 136 is spherically formed due to overgrowth of the metal layer 136, a portion of the second insulating layer 122 can be removed to expose the upper portion 136b.

Figure 2G:
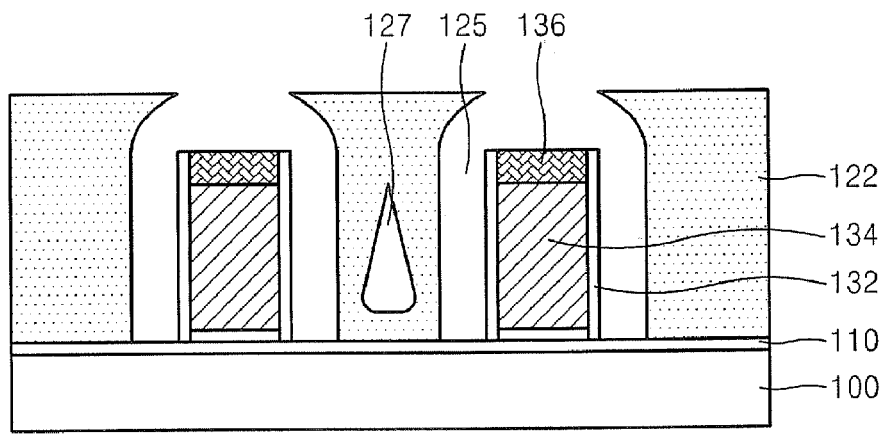

Referring to FIG. 2G, only the capping layer portion 136a of the metal layer 136 is retained, and the mask portions, that is, the upper portion 136b and the overhang portion 136c of the metal layer 136 are removed, and only the capping layer portion 136a is retained. In this regard, the upper portion 136b and the overhang portion 136c may be removed by wet etching using a PAN solution, which is a mixed solution of phosphoric acid, acetic acid, and nitric acid. After the upper portion 136b and the overhang portion 136c are removed, a portion of the second insulating layer 122 protrudes over the air gap 125. The capping layer portion 136a inhibits or possibly prevents copper of Cu wire from being diffused into interlayer dielectrics.

Figure 2H:
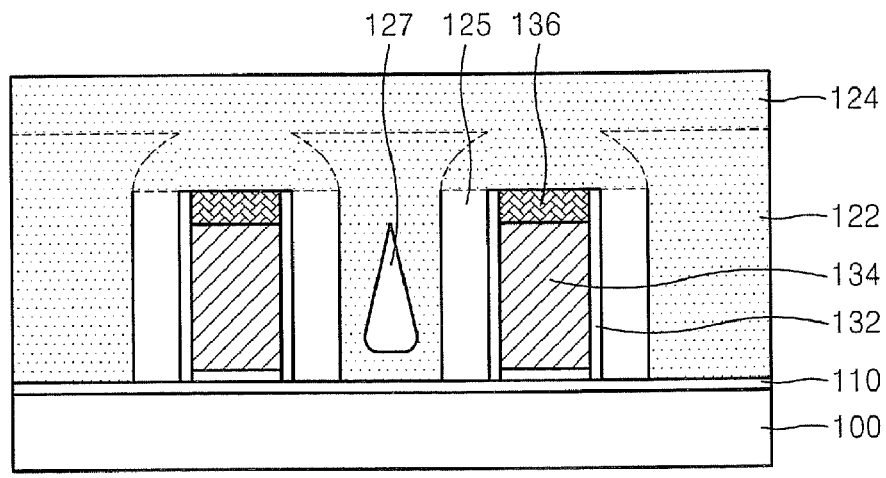

Referring to FIG. 2H, a third insulating layer 124 is formed on the semiconductor substrate 100 from which the upper portion 136b and the overhang portion 136c are removed. The third insulating layer 124 is not conformally formed. Portions of the second insulating layer 122 protruding over the air gap 125 act as a deposition cover, whereby the third insulating layer 124 can be formed not to fill the air gap 125. The third insulating layer 124 may be formed of the same material as that of the second insulating layer 122, or may be formed of a material different from that of the second insulating layer 122. After the third insulating layer 124 is formed, an interlayer dielectric including the air gap 125 and the void 127 is formed.

While the inventive concept has been particularly shown and described with reference to exemplary embodiments thereof, it will be understood that various changes in form and details may be made therein without departing from the spirit and scope of the following claims.

What is claimed is:

1. A method of forming an interlayer dielectric having an air gap, the method comprising:

forming a first insulating layer on a semiconductor substrate, the first insulating layer defining a trench;

forming a metal wire in the trench such that the metal wire is recessed beneath an upper surface of the first insulating layer;

forming a metal layer on the metal wire, wherein the metal layer comprises a capping layer portion filling the recess, a upper portion formed on the capping layer portion, and an overhang portion formed on the portion of the first insulating layer adjacent to the trench protruding sidewards from the upper portion;

removing the first insulating layer;

forming a second insulating layer on the semiconductor substrate to cover the metal layer, whereby an air gap is formed below the overhang portion of the metal layer;

removing a portion of the second insulating layer to expose the upper portion of the metal layer;

removing the upper portion and the overhang portion of the metal layer; and forming a third insulating layer on the semiconductor substrate from which the upper portion and the overhang portion have been removed to maintain the air gap.

2. The method of claim 1, wherein forming the first insulating layer is preceded by forming an etch stop layer on the semiconductor substrate.

3. The method of claim 1, wherein forming the metal wire is preceded by forming a barrier layer on sidewalls and a bottom of the trench.

4. The method of claim 1, wherein the metal wire is formed by electroless plating.

5. The method of claim 1, wherein the metal wire comprises at least one layer of copper (Cu), platinum (Pt) and/or silver (Ag).

6. The method of claim 5, wherein the metal wire comprises an impurity of P, B, W, Mn, or Mo.

7. The method of claim 1, wherein the metal layer is formed by electroless plating.

8. The method of claim 1, wherein the metal layer comprises at least one layer of Co, Ni, Pt, Pd, Rh, Ru, and/or Re.

9. The method of claim 8, wherein the metal layer comprises an impurity of P, B, W, Mn, or Mo.

10. The method of claim 1, wherein the second insulating layer has a void between the metal wires.

11. The method of claim 1, wherein the first insulating layer is selectively removed by wet etching.

12. The method of claim 1, wherein the metal layer is removed by wet etching using a mixed solution of phosphoric acid, acetic acid, and nitric acid.

13. The method of claim 1, wherein the second insulating layer comprises a low-k dielectric having a dielectric constant of from about 1.5 to about 4.0.

14. The method of claim 13, wherein the second insulating layer comprises one selected from the group consisting of HOSP, HSQ, SiLK™, Flare™, Black-Diamond™, and these materials with increased porosity.

15. The method of claim 1, wherein the third insulating layer comprises the same material as that of the second insulating layer.

16. The method of claim 1, wherein the third insulating layer comprises silicon oxide.

* * * * *